(12) United States Patent
Kumagai

(10) Patent No.: US 6,462,385 B1
(45) Date of Patent: Oct. 8, 2002

(54) SEMICONDUCTOR MEMORY DEVICE WITH LATCH-UP SUPPRESSION

(75) Inventor: Takashi Kumagai, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/447,991

(22) Filed: Nov. 23, 1999

(30) Foreign Application Priority Data

Nov. 24, 1998 (JP) ............................................. 10-349356

(51) Int. Cl.⁷ .......................... H01L 29/76; H01L 27/11; H01L 29/00
(52) U.S. Cl. ........................ 257/372; 257/371; 257/369; 257/903; 257/904; 257/499
(58) Field of Search ................................. 257/371, 372, 257/381, 385, 499, 369, 903, 904; 365/185.26

(56) References Cited

U.S. PATENT DOCUMENTS

| | | | | |
|---|---|---|---|---|
| 5,014,105 A | * | 5/1991 | Hata et al. ..................... | 357/42 |
| 5,428,239 A | * | 6/1995 | Okumura et al. ............ | 257/371 |
| 5,478,759 A | * | 12/1995 | Mametani et al. ............ | 437/30 |
| 5,514,889 A | * | 5/1996 | Cho et al. .................... | 257/316 |
| 5,927,991 A | | 7/1999 | Lee | |
| 5,939,743 A | * | 8/1999 | Ema .......................... | 257/296 |
| 5,945,715 A | * | 8/1999 | Kuriyama .................... | 257/369 |
| 6,242,294 B1 | * | 6/2001 | Mitani et al. ............... | 438/228 |

FOREIGN PATENT DOCUMENTS

| | | |
|---|---|---|
| JP | 08-330528 | 12/1996 |
| JP | 09-199612 | 7/1997 |

* cited by examiner

*Primary Examiner*—Nathan J. Flynn
*Assistant Examiner*—Johannes Mondt
(74) *Attorney, Agent, or Firm*—Hogan & Hartson, LLP

(57) ABSTRACT

A semiconductor memory device has a semiconductor substrate, a peripheral circuit region and a memory cell region on the principal surface of the semiconductor substrate. The semiconductor memory device has a first well formed in the peripheral circuit region, a second well of first conductivity type and a third well of second conductivity type formed in the memory cell region having substantially the same depth, and a device element isolator formed in the memory cell region for isolating a device element formed in the second well from a device element formed in the third well. The second and third wells extend to an area under the device element isolator. The second and third wells extend to a level under the device element isolator. The second and third wells may include a first layer having a depth shallower than the first well, and a second layer having substantially the same depth as the first well. The first layer of the second well overlaps the first layer of the third well under the device element isolator. The second layer of the second well and the second layer of the third well are isolated from each other. The depth of the first layer in the second and third wells formed in the memory cell region may be shallower than the depth of the first well formed in the peripheral circuit region.

10 Claims, 6 Drawing Sheets

SEMICONDUCTOR MEMORY DEVICE WITH LATCH-UP SUPPRESSION

BACKGROUND OF THE INVENTION

1. Field of the Invention

The present invention relates to a semiconductor memory device having twin wells and a manufacturing method thereof.

2. Description of Related Art

There are a variety of different types of SRAMs, one form of semiconductor memory devices. One type of SRAMs employs CMOS devices. SRAMs using the CMOS have been aggressively developed in recent years since the CMOS has excellent characteristics such as low power consumption. However, the CMOS has a serious drawback in that it exhibits a latch-up phenomenon.

SUMMARY OF THE INVENTION

It is an object of the present invention to solve the problems as described above. It is another object of the present invention to provide a semiconductor memory device having a construction in which the latch-up phenomenon hardly occurs, and a method for manufacturing the same.

In accordance with one embodiment of the present invention, a semiconductor memory device has a semiconductor substrate, a peripheral circuit region and a memory cell region on the principal surface of the semiconductor substrate. The semiconductor memory device has a first well formed in the peripheral circuit region, a first conductivity type second well formed in the memory cell region, a second conductivity type third well formed in the memory cell region and having substantially the same depth as the depth of the second well, and a device element isolator formed in the memory cell region for isolating the device element formed in the second well from the device element formed in the third well. The second and third wells extend to an area under the device element isolator. The second and third wells may be further provided with a first layer having a depth shallower than the first well, and a second layer having the same depth as the first well. The first layer of the second well overlaps the first layer of the third well under the device element isolator. The second layer of the second well and the second layer of the third well are isolated from each other.

The depth of the first layer in the second and third wells formed in the memory cell region may be shallower than the depth of the first well formed in the peripheral circuit region in accordance with one embodiment of the present invention. Accordingly, overlap of the first layers at the boundary between the first layer in the second well and the first layer in the third well under the device element isolator can be diminished. The reasons will be described below. Therefore, in accordance with an embodiment of the present invention, the distance between one well and a source/drain in another well formed adjacent to the one well may be prevented from becoming too short without elongating the length of the device element isolator. Consequently, the embodiment structure prevents an increase in the leak current in a parasitic MOS that triggers the latch-up phenomenon while miniaturizing the semiconductor memory device.

In accordance with one embodiment, the second and third wells may have second layers. Resistance of the second and third wells (substrate resistance) can be lowered by the second layers, while preventing occurrence of the latch-up phenomenon.

In accordance with one embodiment, the second layer in the second well and the second layer in the third well are isolated from each other. If the two layers were to have contact with each other, the overlap between the second well and the third well at their boundary could not be reduced. The reason will also be described below.

In accordance with embodiments of the present invention, the device element isolator includes a LOCOS oxide film, a semi-recess LOCOS oxide film, and a shallow trench (with a depth of about 0.4 to 0.8 $\mu$m) or the like. The term "source/drain" refers to at least one of a source region and a drain region.

The second well has the same depth as the depth of the third well in accordance with one embodiment of the present invention. Therefore, substantially no imbalance in performance between transistors, attributable to the difference between the well depths, occurs in the memory cell region. It is noted that, in this specification, the term "the same depth" is not strictly limited to the same depth but also covers a well depth difference that causes substantially no imbalance in performance between transistors.

Since the second well has the same depth as the third well according to the present invention, the depth of the source/drain in the second well can be adjusted to be the same as the depth of the source/drain in the third well. Therefore, no imbalance in performance among transistors due to different depths of the source/drain is caused.

In accordance with one embodiment of the present invention, the source/drain to be formed in the second and third wells does not become too shallow, compared to the source/drain to be formed in the first well.

The well contact region for fixing the well potential is isolated from the source/drain. The second and third wells extend to a position under the device element isolator. Consequently, the wells can be extended to the well contact region, allowing the second and third wells to be readily connected to the well contact region.

The source/drain of a transistor formed in the first well, the source/drain of a transistor formed in the second well and the source/drain of a transistor formed in the third well preferably have substantially the same depth in accordance with one embodiment of the present invention. As a result, sources/drains of the same conductivity type can be simultaneously formed.

In a preferred embodiment of the present invention, the first, second and third wells are retrograded wells. The retrograded well refers to a well formed by high-energy ion implantation without using a thermal diffusion method.

Each of the first, second and third well as a retrograded well is provided with a layer with a first concentration, a layer with a second concentration, a layer with a third concentration and a layer with a fourth concentration in the order from the top to the bottom. The first layer in the second well and the first layer in the third well are composed of the layers with the first, second and third concentrations. The second layer in the second well and the second layer in the third well are composed of the layers with the fourth concentration. The layer with the first concentration comprises, for example, a channel doped layer for adjusting the threshold voltage $V_{th}$ of the transistor. The layer with the second concentration comprises, for example, a punch-through stopper layer for suppressing a short-channel effect of the transistor. The layer with the third concentration comprises, for example, a channel-cut layer for preventing action of a parasitic transistor in a region including the device element isolator. The layer with the fourth concentration comprises, for example, a low resistive layer for decreasing the well resistance.

In accordance with one embodiment of the present invention, a CMOS type cell SRAM is formed in the memory cell region. The CMOS type cell SRAM refers to an SRAM in which the cell is composed of the CMOS.

In a preferred embodiment of the present invention, the length of the device element isolator for dividing adjacent wells in the memory cell region is in the range of about 0.2 μm to 1.6 μm. Since the boundary between the second well and the third well is required to be located under the device element isolator, and a positional deviation may occur in patterning the resist, a minimum length to cover the positional deviation is necessary in the device element isolator. This minimum length may preferably be about 0.2 μm. When the length of the device element isolator is longer than 1.6 μm, the memory cell size may become too large.

The depth of the first layers in the second and third wells is preferably in the range of about 0.5 μm to 1.2 μm in accordance with one embodiment of the present invention. When the depth of the first layer in the second and third wells is less than about 0.5 μm, the depth of the device element isolator may become deeper than the depth of the first layer, thereby causing a problem in forming the well contact region for fixing the well potential. When the depth of the first layers in the second and third wells is deeper than about 1.2 μm, an overlap between the first layer in the second well and the first layer in the third well at the boundary under the device element isolator may become too large.

In a preferred embodiment of the present invention, the first well comprises a first conductivity type well and a second conductivity type well. In other words, the first well comprises a twin well.

By the construction described above, the first conductivity type well in the first well and the second well can be simultaneously formed, and the second conductivity type well in the first well and the third well can be simultaneously formed.

In accordance with another embodiment of the present invention, a semiconductor memory device has a semiconductor substrate defining a peripheral circuit region and memory cell region on the principal face, a first well formed in the peripheral circuit region, a first conductivity type second well formed in the memory cell region, and a second conductivity type third well formed in the memory cell region, the second and third wells having a first layer and a second layer extending to a position under the first layer, and the second well and the third well having the same depth with each other. The semiconductor memory device may be formed by the following steps: (a) a device element isolator is formed on the principal surface; (b) a resist pattern is formed on the principal surface, in which an opening in the resist pattern is positioned at the second well forming region so that the second layer in the second well does not make contact with the third well; (c) the second layer is formed in the second well at the position under the device element isolator by ion-implantation of impurities in the second well forming region; (d) a resist pattern is formed on the principal surface, in which an opening in the resist pattern is positioned at the third well forming region so that the second layer in the third well does not make a contact with the second well; (e) the second layer of the third well is formed at the position under the device element isolator by ion-implantation of impurities in the third well forming region; (f) a resist pattern is formed on the principal surface, in which an opening in the resist pattern is positioned at the second well forming region; (g) the first layer is formed in the second well at a position under the device element isolator by ion-implantation of impurities in the second well forming region; (h) a resist pattern is formed on the principal surface, in which an opening of the resist pattern is positioned at the third well forming region; and (i) the first layer is formed in the third well at a position under the device element isolator by ion-implantation of impurities in the third well forming region.

In accordance with embodiments of the present invention, a semiconductor memory device can be manufactured in such a manner that the distance between a well and a source/drain formed in another well adjacent to the well does not become too short without having to undesirably extend the length of the device element isolator, and the resistance of the second and third wells is lowered.

In a preferred embodiment of the present invention, a resist pattern having a thickness of about 3.0 μm to 8.0 μm is used as a mask in step (b) and step (d), and a resist pattern having a thickness of about 1.2 μm to 2.5 μm is used as a mask in step (f) and step (h).

When the thickness of the resist pattern in steps (b) and (d) is smaller than about 3.0 μm, impurities may pass through the resist pattern during ion-implantation for forming the retrograded well. When the thickness of the resist pattern is larger than about 8.0 μm, on the other hand, the shape of the end of the resist pattern is hardly controllable, causing a problem that the length of the device element isolator becomes elongated.

When the thickness of the resist pattern in steps (f) and (h) is smaller than about 1.2 μm, impurities may shoot through the resist pattern during ion-implantation for forming the retrograded well. When the thickness of the resist pattern is larger than about 2.5 μm, on the other hand, the dimensional accuracy of the resist becomes poor, causing a problem that overlap between the second well and third well under the device element isolator becomes large.

Either a positive resist or a negative resist can be used in steps (b) and (d). Also, a positive resist or a negative resist can be used in steps (f) and (h). However, preferably, a positive resist may be used in steps (f) and (h), because the positive resist is excellent in controlling the verticality and dimensions of edges of the resist pattern.

Preferably, side faces of the openings formed in the resist patterns in steps (b) and (d) may be deviated toward an active region side by about 0.3 μm to 0.8 μm from the center of the device element isolator.

The resist pattern suffers a light proximity effect, loading effect and alignment error. The second layer in the well overlaps the first layer in the confronting well when the deviation is smaller than 0.3 μm.

On the other hand, when the deviation is larger than about 0.8 μm, the dimension of the opening of the resist pattern becomes too small. As a result, accuracy in matching the resist patterns deteriorates substantially.

Other features and advantages of the invention will be apparent from the following detailed description, taken in conjunction with the accompanying drawings which illustrate, by way of example, various features of embodiments of the invention.

PREFERRED EMBODIMENTS

Figure 1:
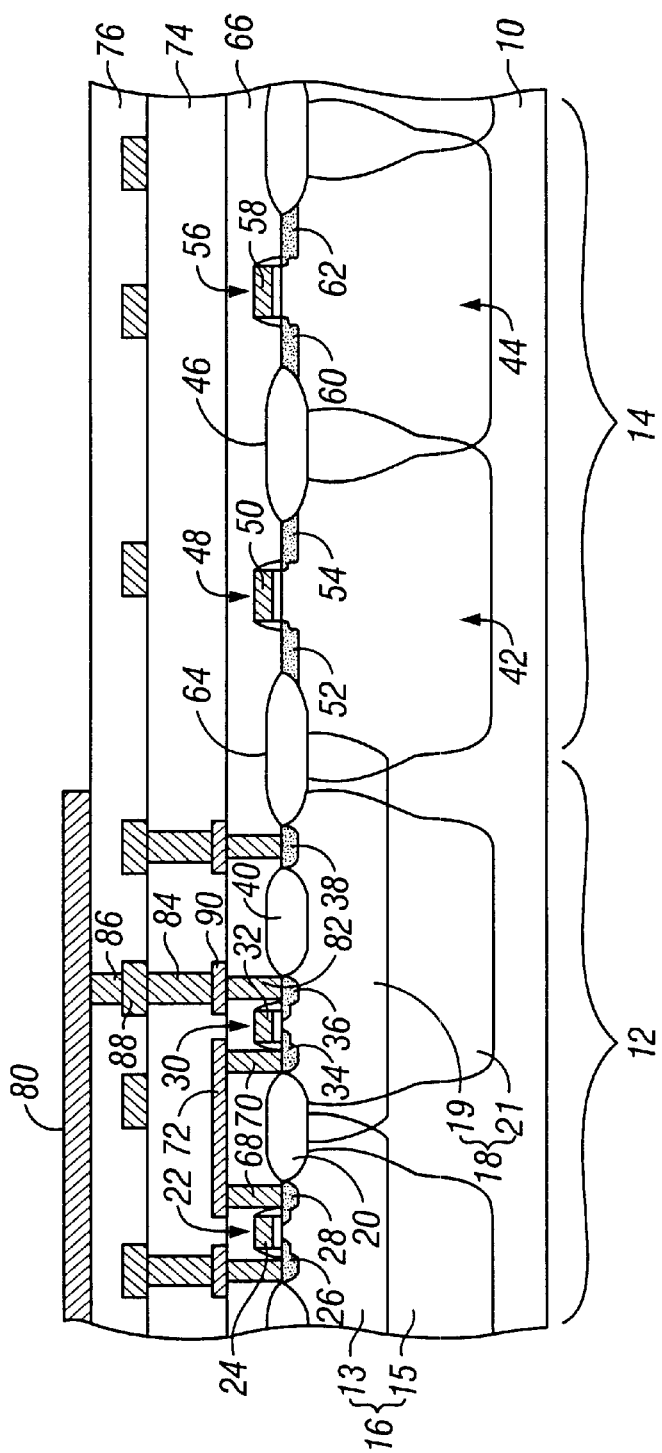
FIG. 1 shows a cross section of a semiconductor memory device in accordance with an embodiment of the present invention.

FIG. 1 shows a cross section of a semiconductor memory device in accordance with one embodiment of the present invention. The semiconductor memory device is an SRAM. Referring to FIG. 1, the main surface of a p-type silicon substrate 10, as one example of a semiconductor substrate, is divided into a memory cell region 12 and a peripheral circuit region 14.

An n-well 16 and a p-well 18 adjacent to the n-well are formed in the memory cell region 12. The n-well 16 and the p-well 18 are retrograded wells. In accordance with one embodiment, the n-well 16 may be composed of a first layer 13 and a second layer 15. The first layer 13 and second layer 15 partially overlap each other. The second layer 15 is deeper than the first layer 13.

The p-well 18 is composed of a first layer 19 and a second layer 21. The first layer 19 and the second layer 21 partially overlap each other. The second layer 21 is deeper than the first layer 19.

The wells 16 and 18 overlap each other at the boundary between the first layer 13 and the first layer 19. However, the second layer 15 and the second layer 21 are isolated from each other. The second layer 15 makes no contact with the first layer 19. The second layer 21 also makes no contact with the first layer 13. A semi-recessed LOCOS oxide film 20 is formed at the boundary between the first layer 13 and first layer 19.

A p-channel transistor 22 is formed in the n-well 16. The p-channel transistor 22 is provided with a gate electrode 24, a source 26 and a drain 28. An n-channel transistor 30 is formed in the p-well 18. The n-channel transistor 30 is provided with a gate electrode 32, a source 34 and a drain 36. A well contact region 38 is formed in the p-well 18. A wiring for fixing the potential of the p-well 18 is connected to the well contact region 38. The well contact region 38 is connected to a ground line. The well contact region 38 is isolated from the drain 36 by a semi-recessed LOCOS oxide film 40. The well contact regions are also formed in the n-wells 16 and 42 and p-well 44, though they are not shown in the drawing.

The n-well 42 and the p-well 44 adjacent to the n-well 42 are formed in the peripheral circuit region 14. The n-well 42 and the p-well 44 are deeper than the first layers 13 and 19. The n-well 42 and the p-well 44 have the same depth as that of the second layers 15 and 21.

The n-well 42 and the p-well 44 are retrograded wells. These wells overlap each other at a boundary between the n-well 42 and the p-well 44. A semi-recessed LOCOS oxide film 46 is formed over the boundary.

A p-channel transistor 48 is formed over the n-well 42. The p-channel transistor 48 is provided with a gate electrode 50 and source/drain 52 and 54. An n-channel transistor 56 is formed over the p-well 44. The n-channel transistor 56 is provided with a gate electrode 58 and source/drains 60 and 62. A semi-recessed LOCOS oxide film 64 isolates the memory cell region 12 from the peripheral circuit region 14.

An interlayer dielectric film 66 is formed over the principal surface of the silicon substrate 10 so as to cover the memory cell region 12 and the peripheral circuit region 14. Contact holes for exposing the drain 28 and the source 34 are provided in the interlayer dielectric film 66. The contact holes are filled with conductive materials 68 and 70. A wiring film 72 is formed on the interlayer dielectric film 66. The drain 28 is electrically connected to the source 34 via the wiring film 72, and the conductive materials 68 and 70.

An interlayer dielectric film 74 is formed on the interlayer dielectric film 66. A plurality of wiring films are formed on the interlayer dielectric film 74. An interlayer dielectric film 76 is formed on the interlayer dielectric film 74 so as to cover these wiring films. A bit line 80 is formed on the interlayer dielectric film 76. Contact holes are formed in the interlayer dielectric films 66, 74 and 76. These contact holes are filled with conductive materials 82, 84 and 86. The bit line 80 is connected to the drain 36 via the conductive material 86, a pad layer 88, the conductive material 84, a pad layer 90 and the conductive material 82.

A method for manufacturing the semiconductor memory device in accordance with one embodiment of the present invention will be described below.

Figure 2:
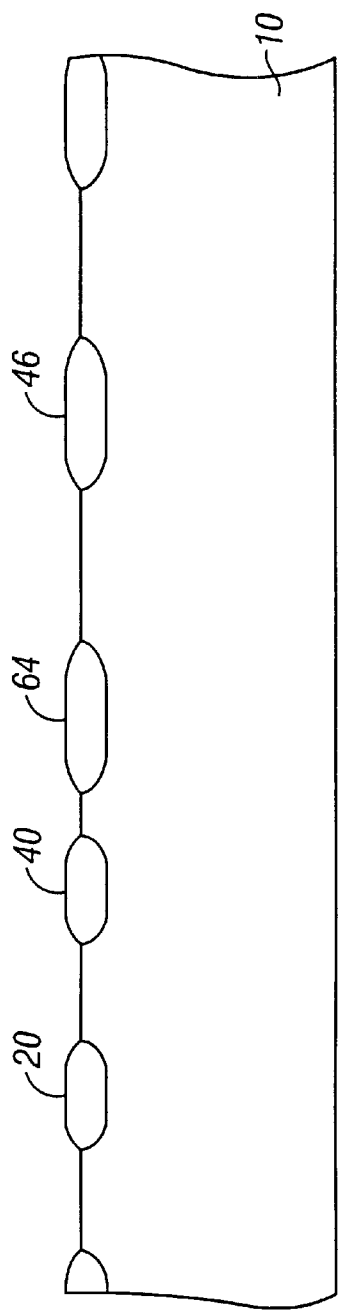
FIG. 2 shows a cross section of a semiconductor memory device in a first manufacturing step in accordance with an embodiment of the present invention.

First, a plurality of trenches are formed on the surface of the silicon substrate 10 on which an anti-oxidation film comprising, for example, silicon nitride is formed. Oxide films are formed in these trenches by a LOCOS method. By conducting the LOCOS method, semi-recessed LOCOS oxide films 20, 40, 46 and 64 with a thickness of 0.2 $\mu$m to 0.7 $\mu$m are formed, as shown in FIG. 2.

Figure 3:
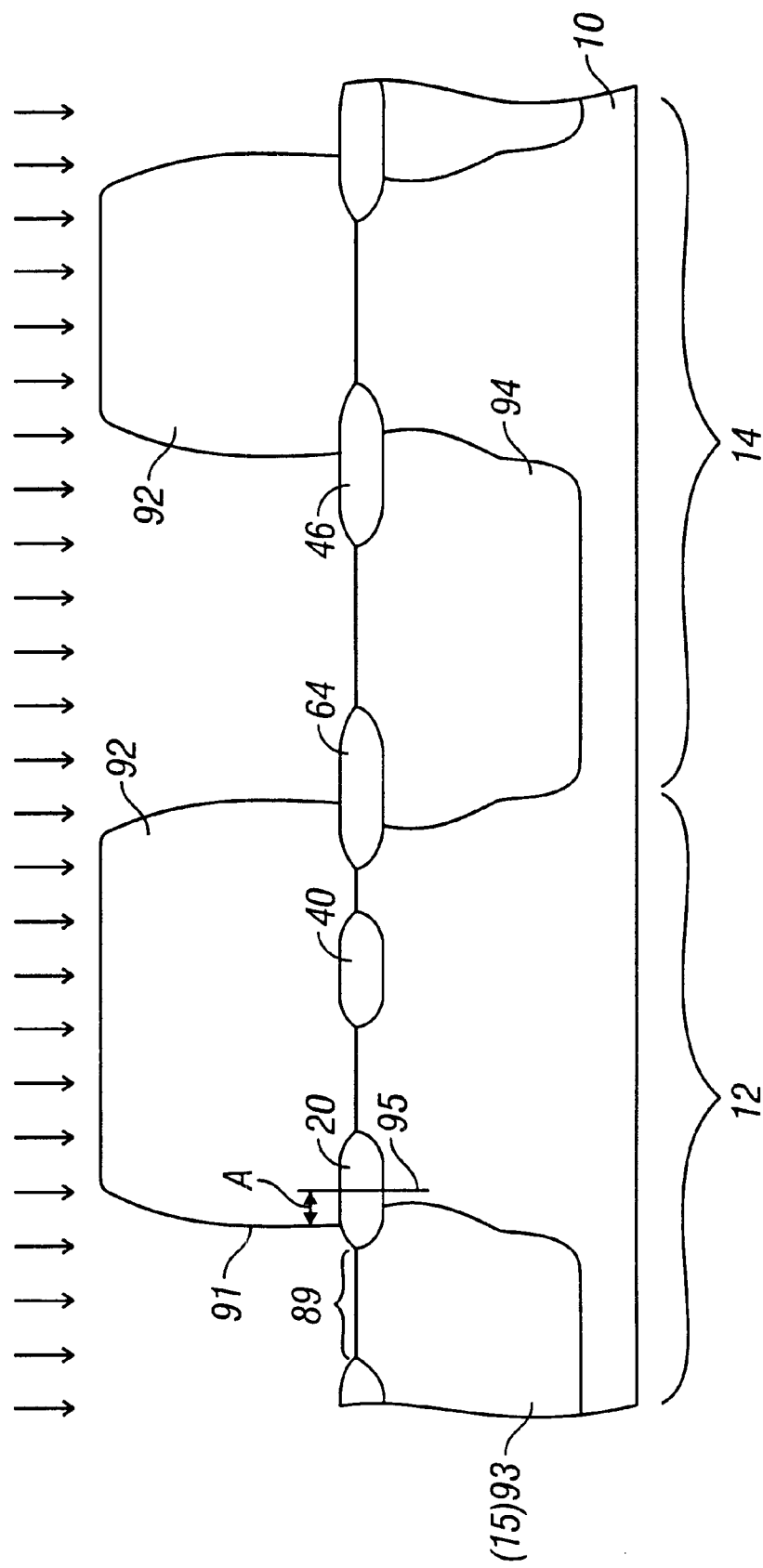
FIG. 3 shows a cross section of a semiconductor memory device in a second manufacturing step in accordance with the embodiment of the present invention.

Then, a resist pattern 92 with a thickness of about 3.0 $\mu$m to 8.0 $\mu$m is formed in such a manner that the n-well forming regions in the memory cell region 12 and the peripheral circuit region 14 are exposed, as shown in FIG. 3. The side face 91 of the opening of the resist pattern 92 is located at a position that deviates toward an active region 89 side by an amount A (preferably, the amount A being in a range between about 0.3 $\mu$m and 0.8 $\mu$m) from the center of the semi-recessed LOCOS oxide film 20 in the memory cell region 12, as shown in FIG. 3.

Dimensional errors (deviations from the designed dimensions) and collapse of the resist occur in the resist pattern 92 on the semi-recessed LOCOS oxide film by a proximity effect due to, for example, differences in pattern density of the processed pattern, or by a loading effect.

Low-resistance layers 93 and 94 are formed by implanting phosphorus into the silicon substrate 10 using the resist pattern 92 as a mask. The implantation energy is in a range between about 500 KeV and about 3 MeV with a dosage of about 5E12 to 5E13. The low-resistance layer 93 corresponds to the second layer 15.

Figure 4:
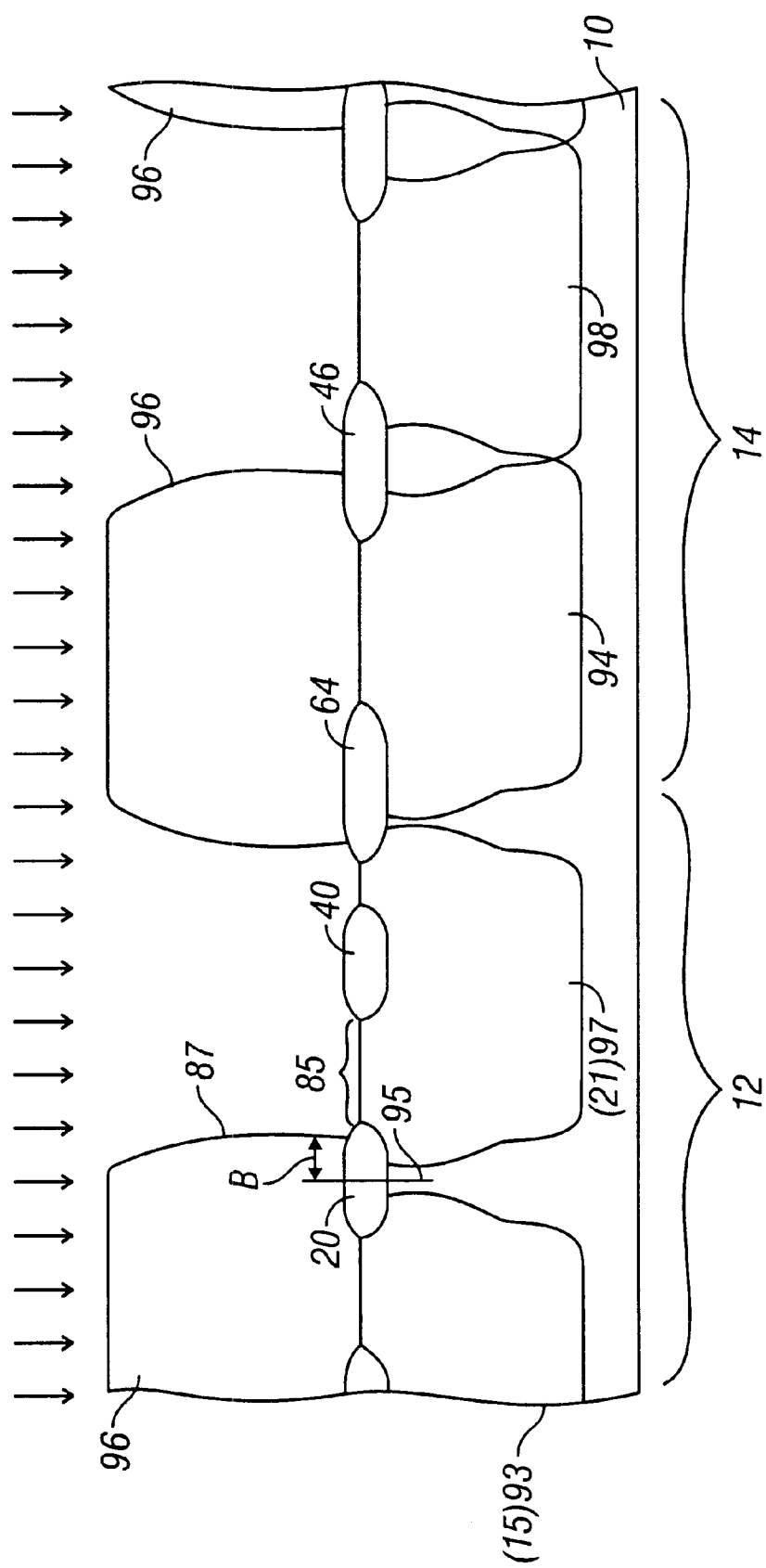
FIG. 4 shows a cross section of a semiconductor memory device in a third manufacturing step in accordance with the embodiment of the present invention.

A resist pattern 96 with a thickness of about 3.0 to about 8.0 $\mu$m is formed in such a manner that the p-well forming regions in the memory cell region 12 and the peripheral circuit region 14 are exposed, as shown in FIG. 4. The side face 87 of the opening of the resist pattern 96 is located at a position that deviates toward an active region 85 side by an amount B (preferably, the amount B being in the range of about 0.3 µm to about 0.8 µm) from the center of the semi-recessed LOCOS oxide film 20 in the memory cell region 12, as shown in FIG. 4.

Dimensional errors (deviations from the designed dimensions) and collapse of the resist occur in the resist pattern 96 on the semi-recessed LOCOS oxide film by a proximity effect due to, for example, differences in pattern density of the processed pattern, or by a loading effect.

Low-resistance layers 97 and 98 are formed by implanting boron into the silicon substrate 10 using the resist pattern 96 as a mask. The implantation energy is in a range of about 300 KeV to about 2 MeV with a dosage of about 5E12 to about 5E13. The low-resistance layer 97 corresponds to the second layer 21.

Figure 5:
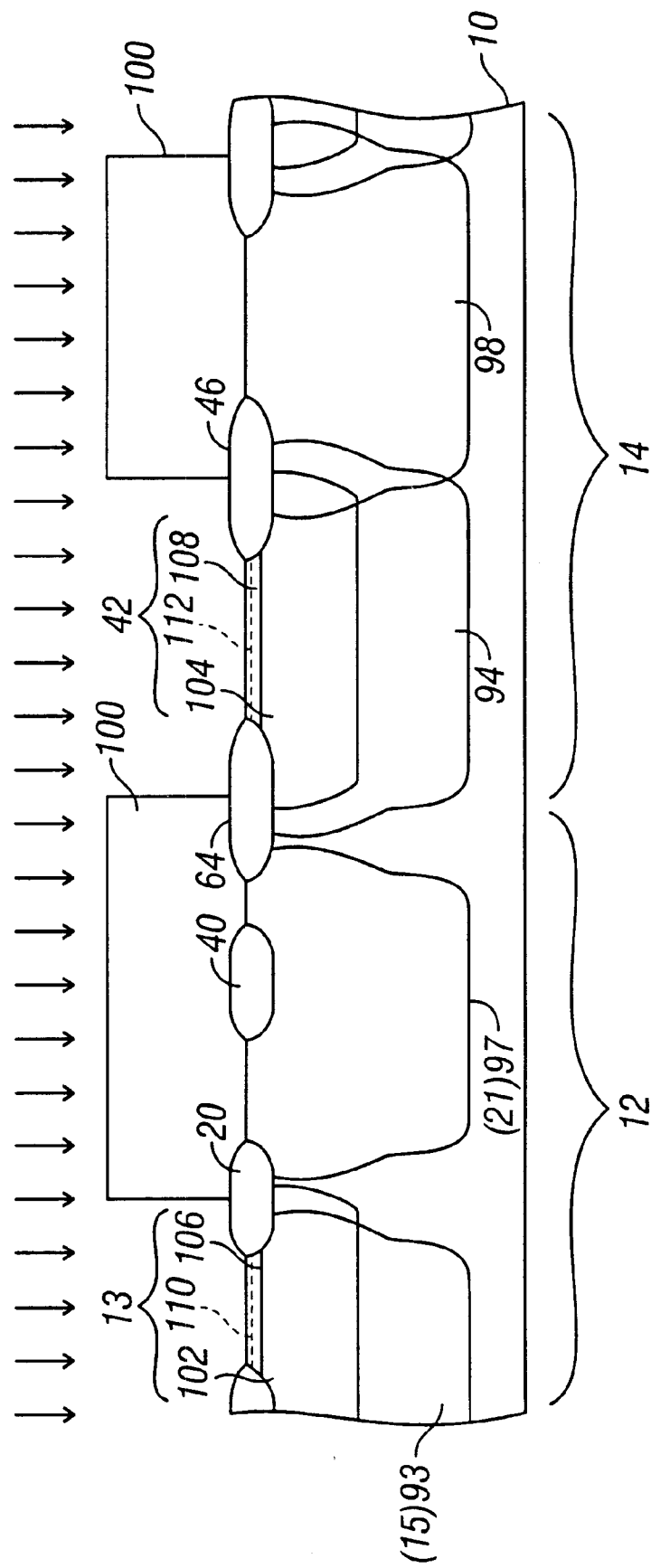
FIG. 5 shows a cross section of a semiconductor memory device in a fourth manufacturing step in accordance with the embodiment of the present invention.

A resist pattern 100 with a thickness of about 1.2 µm to about 2.5 µm is formed in such a manner that the n-well forming regions in the memory cell region 12 and the peripheral circuit region 14 are exposed, as shown in FIG. 5. Channel-cut layers 102 and 104 are formed by implanting phosphorous into the silicon substrate 10 using the resist pattern 100 as a mask. The implantation energy is in a range of about 200 KeV to about 500 KeV with a dosage of about 3E12 to about 2E13.

Then, punch-through stopper layers 106 and 108 are formed by implanting phosphorous into the silicon substrate 10 using the resist pattern 100 as a mask. The implantation energy is in a range of about 100 KeV to about 200 KeV with a dosage of about 2E12 to about 1E13. The punch-through stopper layers 106 and 108 may also be formed by using arsenic. The implantation energy for arsenic is in a range of about 150 KeV to about 300 KeV while the dosage is about 2E12 to about 1E13.

Ions are implanted into the silicon substrate 10 in the next step using the resist pattern 100 as a mask to form channel doped layers 110 and 112. The channel doped layers 110 and 112 are formed by using any of the following conditions (a), (b) and (c), alone or in combination:
 (a) phosphorus, about 20 KeV to about 100 KeV, about 1E12 to about 1E13;
 (b) boron difluoride, about 30 KeV to about 100 KeV, about 1E12 to about 1E13; and
 (c) boron, about 10 keV to about 50 keV, about 1E12 to about 1E13.

The n-well 16 containing the channel-cut layer 102, the punch-through stopper layer 106 and the channel dope layer 110 as well as the low resistive layer 93 formed below these layers is completed in the memory cell region 12 by the steps described above. The first layer 13 is composed of the channel-cut layer 102, the punch-through stopper layer 106 and the channel dope layer 110. The n-well 42 containing the low resistive layer 94, the channel-cut layer 104, the punch-through stopper layer 108 and channel dope layer 112 is completed in the peripheral circuit region 14.

Figure 6:
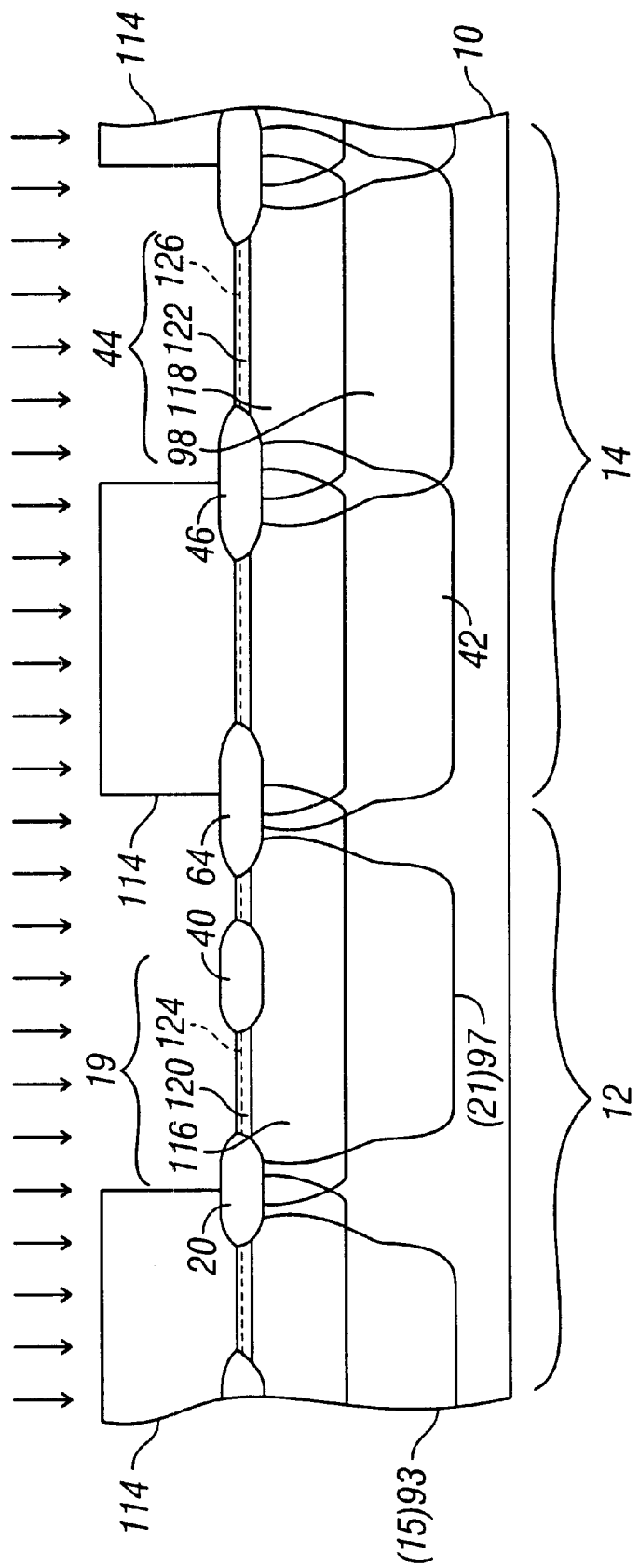
FIG. 6 shows a cross section of a semiconductor memory device in a fifth manufacturing step in accordance with the embodiment of the present invention.

A resist pattern 114 with a thickness of about 1.2 µm to about 2.5 µm is formed in such a manner that the p-well forming region in the memory cell region 12 and peripheral circuit region 14 are exposed, as shown in FIG. 6. Boron is implanted into the silicon substrate 10 using the resist pattern 114 as a mask to form channel-cut layers 116 and 118. The implantation energy is in a range of about 100 KeV to about 300 KeV with a dosage of about 3E12 to about 2E13.

Boron is then implanted into the silicon substrate 10 using the resist pattern 114 as a mask to form punch-through layers 120 and 122. The implantation energy is in the range of about 50 KeV to about 200 KeV with a dosage of about 2E12 to about 1E13. The punch-through stopper layers 120 and 122 may overlap with the channel-cut layers 116 and 118 depending on the implantation energy. In this case, a single layer that serves as both of the layers may be formed by a single ion-implantation step.

In the next step, ions are implanted into the silicon substrate 10 using the resist pattern 114 as a mask to form channel dope layers 124 and 126. The channel dope layers 124 and 126 are formed by using any of the following conditions (a), (b) and (c), alone or in combination:
 (a) phosphorus, about 20 KeV to about 100 KeV, about 1E12 to about 1E13;
 (b) boron difluoride, about 30 KeV to about 150 KeV, about 1E12 to about 1E13; and
 (c) boron, about 10 keV to about 50 keV, about 1E12 to about 1E13.

The p-well 18 containing the channel-cut layer 116, the punch-through stopper layer 120 and the channel dope layer 124 as well as the low-resistance layer 97 formed under these layers is completed in the memory cell 12 by the steps described above. The first layer 19 is composed of the channel-cut layer 116, the punch-through stopper layer 120 and the channel dope layer 124. The p-well 44 containing the low-resistance layer 98, the channel-cut layer 118, the punch-through stopper layer 122 and the channel dope layer 126 is completed in the peripheral circuit region 14.

The structure shown in FIG. 1 is completed thereafter by using conventional process technologies. The contact well region 38 is formed in the p-well 18 by ion-implantation used for forming the source and the drain in the p-channel transistor. Drawing of the lines representing the channel-cut layers 102, 104, 116 and 118, punch-through stopper layers 106, 108, 120 and 122, and channel dope layers 110, 112, 124 and 126 are omitted in FIG. 1. The first layer 13 is composed of the channel-cut layer 102, punch-through stopper layer 106, and channel dope layer 110. The second layer 15 is composed of the low resistive layer 93. The first layer 19 is composed of the channel-cut layer 116, punch-through stopper layer 120 and channel dope layer 124. The second layer 21 is composed of the low resistive layer 97.

Some of the advantages obtained by the embodiment of the present invention will be described below.

As shown in FIG. 1, the n-well 16 and the p-well 18 in the memory cell region 12 are divided into the first layers 13 and 19, and the second layers 15 and 21, respectively. In a preferred embodiment, the depth of the first layers 13 and 19 are made shallower than the depth of the n-well 42 and the p-well 44 in the peripheral circuit region 14, and the wells 42 and 44 overlap with each other only at the first layers. This arrangement suppresses leak currents from a parasitic MOS that may trigger a latch-up phenomenon. Moreover, the second layers 15 and 21 serve for lowering the resistance (substrate resistance) of the n-well 16 and the p-well 18. Accordingly, the present embodiment can prevent the latch-up phenomenon. The possibility of generating the latch-up phenomenon is decreased by suppressing the leak current of the parasitic MOS due to the following reasons.

The latch-up phenomenon occurs when the product of a leak current of a parasitic MOS or a substrate current with the substrate resistance account for more than a given value. Reducing the substrate resistance requires to form a deep well. The thickness of the resist pattern is proportional to the depth of the well. For this reason, to form a deep well, the thickness of a resist pattern has to be increased.

If a deep well is formed with a thick resist pattern, the n-well 42 and the p-well 44 overlap each other in a large area beneath the semi-recessed LOCOS oxidation layer 46, in the peripheral circuit region 14, as shown in FIG. 1. The reason for this is described with reference to FIG. 7.

Figure 7:
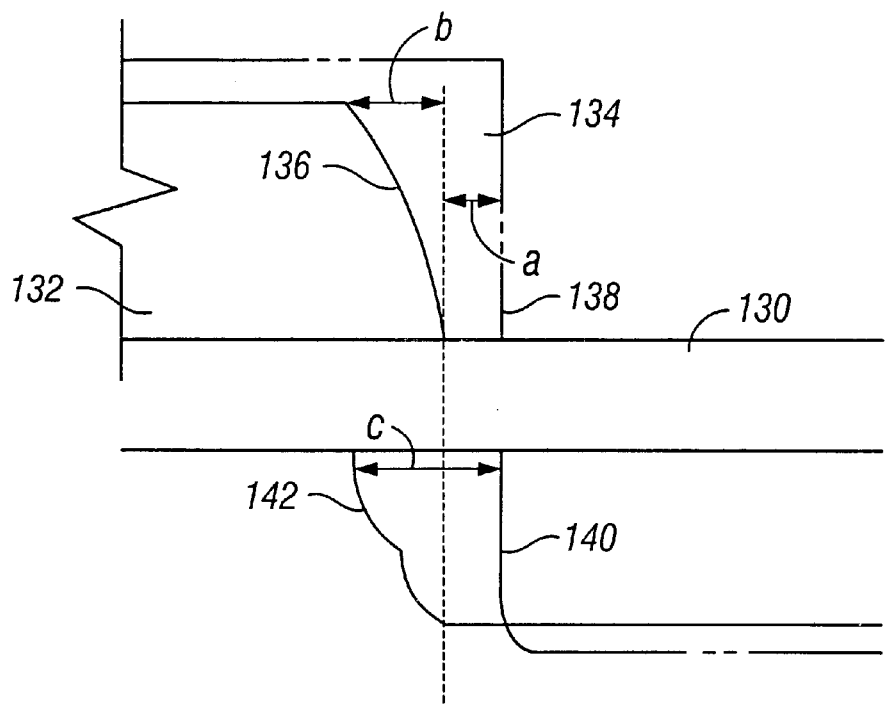
FIG. 7 shows a cross-sectional view showing a change in configuration of a resist pattern.

FIG. 7 shows a state in which a resist pattern 132 formed over a device element isolation structure 130. FIG. 7 shows a resist end portion 136, namely, an end portion of the resist pattern 132. FIG. 7 also shows a designed resist pattern 134 having a designed resist end portion 138.

The letter a denotes a receding distance due to the proximity effect and loading effect. The letter b represents a shrinkage at the upper edge of the resist when the resist pattern is baked. The top edge of the resist end portion 136 recedes by an amount of a+b from the resist end portion 138.

Reference numeral 140 denotes a well end portion if the well is to be formed with the designed resist pattern 134 as a mask. Reference numeral 142 denotes a well end portion when the well is actually formed with the resist pattern 132 as a mask. The upper edge of the well end portion 142 advances by an amount c from the upper edge of the well end portion 140 under the influence of the recession of the top edge of the resist end portion 136. This increases the intrusion of ions into the adjacent well, thereby expanding the overlapped area. The effect of this expanded overlapped area is discussed with reference to FIG. 8.

Figure 8:
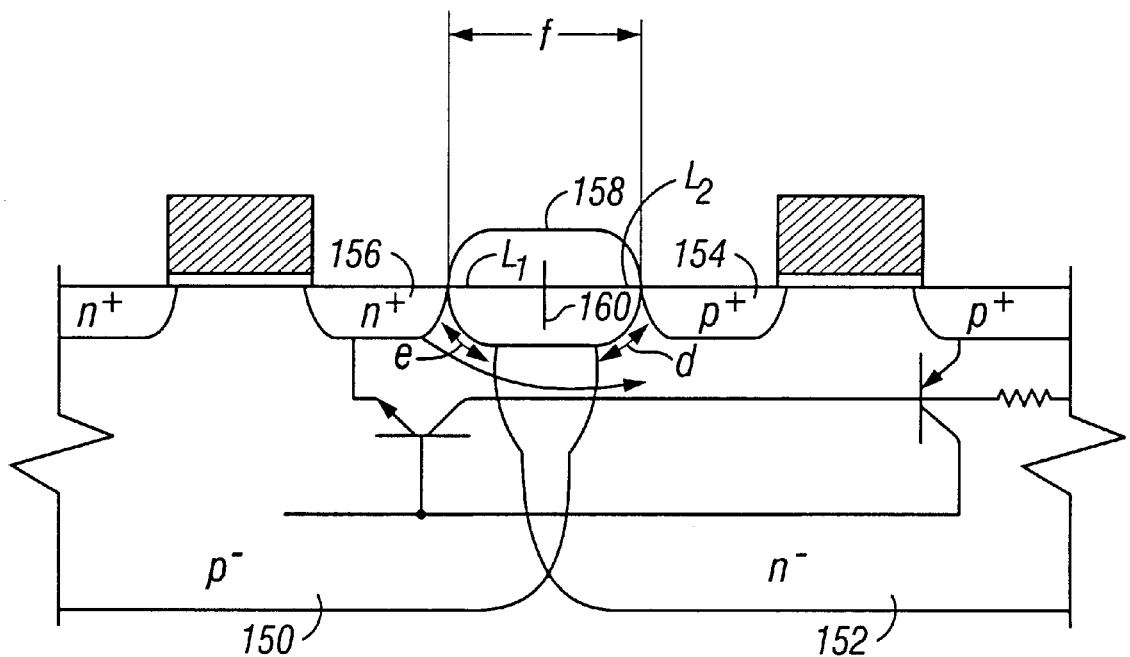
FIG. 8 shows a cross-sectional view to illustrate a latch-up phenomenon.

When a p-well 150 and an n-well 152 overlap each other in a large area as shown in FIG. 8, the one or the both of the distance d between a p-type source/drain 154 and the p-well 150 and the distance e between an n-type source/drain 156 and the n-well 152 is shortened depending on the amount of the ion-implantation dose during the well formation. For example, when the distance e shortens, a leak current of a parasitic MOS tends to flow to the n-well 152 from the n-type source/drain 156 through the p-well 150. This is attributable to a shortened effective channel length of the parasitic MOS transistor. The leak current in the parasitic MOS transistor may work as a trigger current for latchup.

If a well is formed using a thin resist pattern, for example, having a thickness of 2 μm or less, the overlapped area is made relatively small. This is because neither the receding distance a at the resist end position nor the shrinkage b at the top end edge of the resist occur in the end portion of the resist pattern.

When the length f of the device isolation structure 58 is made greater, the distances d and e may not become shorter. In the peripheral circuit area having space margin available, the length f of the device isolation structure may be made greater. However, if the length f of the device isolation structure 158 is made greater in the memory cell area where no additional space is available, miniaturization of the memory cell may not be achieved.

The substrate current is relatively large in the peripheral circuit area, because a transistor having a wide channel width and a large driving power is arranged in the peripheral circuit area. To prevent latch-up, the substrate resistance needs to be reduced.

For this reason, the well depth has to be increased in the peripheral circuit area. On the other hand, the substrate current is relatively small in the memory cell area, because the size of a transistor constituting a memory cell is small. The latch-up is controlled without greatly reducing the substrate resistance. A shallow well depth of the memory cell area is thus acceptable.

Because of the reasons discussed above, the relatively shallow first layers 13 and 19 are formed in the memory cell region, thereby reducing overlap of the p-well 18 and the n-well 16 to suppress the possibility of generation of the latch-up phenomenon.

The latch-up phenomenon can be prevented in the memory cell region without substantially reducing the substrate resistance, as described above. Resistance of the substrate is further decreased in the present embodiment by providing the second layers 15 and 21 under the first layers 13 and 19, thereby lowering the possibility of generation of the latch-up phenomenon.

In the case of the SRAM, the contact well regions are not necessarily formed for every memory cell, but they may be formed for every 32 bits. The memory cells being remote from the contact well region among the memory cells have a high resistance. Therefore, resistance of the substrate is further reduced in the present embodiment by providing the second layers 15 and 21. As a result, the possibility of generation of the latch-up phenomenon is better suppressed while enlarging the pitch for disposing the well contact region of the memory cell(for example, every 64 bits). Consequently, it is possible to reduce the total area of the well contact regions in the memory cell region according to the present invention.

In accordance with one embodiment of the present invention, the second layers 15 and 21 (the low resistance layers 93 and 97) are formed by the steps described with reference to FIG. 3 and FIG. 4, because of the following reasons. For example, if values of the deviations A and B are zero, the n-well 16 and the p-well 18 are largely overlapped each other because the second layers 15 and 21 (the low resistance layers 93 and 97) are formed using a thick resist pattern.

When the second layers 15 and 21 (the low resistive layers 93 and 97) are formed by the steps described with reference to FIG. 3 and FIG. 4, however, it is possible to form the second layers 15 and 21 (the low resistance layers 93 and 97) in the n-well 16 and the p-well 18 while preventing the n-well 16 from largely overlapping the p-well 18. Consequently, the second layers 15 and 21 (the low resistance layers 93 and 97) can be formed by being isolated from each other.

Moreover, as shown in FIG. 1, the n-well 16 has the same depth as the depth of the p-well 18. As a consequence, no imbalance in performance among transistors, attributable to different well depths, occurs in the memory cell 12.

The p-well 18 is formed down to a level below the semi-recess LOCOS oxide film 40, as shown in FIG. 1. Therefore, the p-well 18 can be elongated to the well contact region 38, enabling the p-well 18 to be readily connected to the well contact region 38. Consequently, the contact well regions in the memory cell region are not necessarily formed for every memory cell, but they may be disposed, for example, for every 32 bits, with the result that the total area of the well contact regions is reduced in the memory cell region. The same is also true to the n-well 16, although it is not shown.

Furthermore, as shown in FIG. 1, the n-well 16 and the p-well 18 are formed down to a level below the semi-recess LOCOS oxide films 20 and 40. As a result, the sources 26 and 36 and drains 28 and 34 can be prevented from being too shallow.

As shown in FIG. 1, the source 26 and the drain 28 formed in the n-well 16 have the same depth as the drain 36 and source 34 formed in the p-well 18. As a result, substantially no imbalance in performance, attributable to different depths of the source and drain, occurs among transistors in the memory cell region 12.

Both the memory cell region 12 and peripheral circuit region 14 have twin-well structures in accordance with the embodiment of the present invention, as shown in FIG. 1.

Reduction of production steps is achieved by simultaneously forming the n-well 16 and the n-well 42, and simultaneously forming the p-well 18 and the p-well 44. In an alternative embodiment, the n-well 16 may be independently formed from the n-well 42, and the p-well 18 may be independently formed from the p-well 44.

The depth of the source 26 and the drain 28 formed in the n-well 16, the depth of the source 34 and the drain 36 formed in the p-well 18, the depth of the source/drain 52 and 54 formed in the n-well 42, and the depth of the source/drain 60 and 62 formed in the p-well 44 are substantially the same with one another. Consequently, the source 26 and the drain 28 and the source/drain 52 and 54 can be simultaneously formed, while simultaneously forming the source 34 and drain 36, and the source/drain 60 and 62, thereby shortening the production steps.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A semiconductor memory device having a semiconductor substrate defining a principal surface, a peripheral circuit region and memory cell region defined on the principal surface of the semiconductor substrate, comprising:

a first well formed in the peripheral circuit region;

a first conductivity type second well formed in the memory cell region;

a second conductivity type third well formed in the memory cell region and having the same depth as the depth of the second well; and a device element isolator formed in the memory cell region for isolating a transistor formed in the second well from a transistor formed in the third well, wherein the second and third wells extend to a level under a transistor isolator, the second and third wells include a first layer having a depth shallower than the first well, and a second layer having substantially the same depth as the first well, the first layer of the second well overlaps the first layer of the third well under a transistor isolator, and the second layer of the second well and the second layer of the third well are isolated from each other.

2. A semiconductor memory device according to claim 1, wherein the second and third wells have well contact regions for fixing well potential.

3. A semiconductor memory device according to claim 1, wherein the depths of source/drain of a transistor formed in the second well are substantially equal to the depths of source/drain of a transistor formed in the third well.

4. A semiconductor memory device according to claim 1, wherein the depths of source/drain of a transistor formed in the first well, the depths of source/drain of a transistor formed in the second well and the depths of source/drain of a transistor formed in the third well are substantially equal to one another.

5. A semiconductor memory device according to claim 1, wherein the first, second and third wells are retrograded wells.

6. A semiconductor memory device according to claim 5, wherein each of the first well, the second well and the third well has, in the order from above, a first-concentration layer, a second-concentration layer, a third-concentration layer and a fourth-concentration layer, the first layer in the second well and the first layer in the third well are composed of the first-concentration layer, the second-concentration layer and the third-concentration layer, and the second layer in the second well and the second layer in the third well are composed of the fourth-concentration layer.

7. A semiconductor memory device according to claim 1, wherein an SRAM of a CMOS type cell is formed in the memory cell region.

8. A semiconductor memory device according to claim 1, wherein the length of the device element isolator is in the range of about 0.2 $\mu$m to about 1.6 $\mu$m.

9. A semiconductor memory device according to claim 1, wherein the depth of the first layers in the second and third wells is in a range of about 0.5 $\mu$m to about 1.2 $\mu$m.

10. A semiconductor memory device according to claim 1, wherein the first well is a twin well comprising a first conductivity type well and a second conductivity type well.

* * * * *